United States Patent [19]
Sotom et al.

[11] Patent Number: 5,687,021
[45] Date of Patent: Nov. 11, 1997

[54] METHOD AND DEVICE FOR COMBINING OPTICAL SIGNALS

[75] Inventors: Michel Sotom, Paris; Corinne Chauzat, Creteil; Dominique De Bouard, Ste Genevieve des Bois; Jean-Michel Gabriagues, Asnieres; Dominique Chiaroni, Antony, all of France

[73] Assignee: Alcatel N.V., Rijswijk, Netherlands

[21] Appl. No.: 653,777

[22] Filed: May 28, 1996

[30] Foreign Application Priority Data

May 29, 1995 [FR] France ................... 95 06318

[51] Int. Cl.$^6$ ....................................... H01S 3/00
[52] U.S. Cl. ................ 359/333; 359/244; 359/108
[58] Field of Search ........................ 359/541, 108, 359/341, 333, 107, 239, 243, 244; 372/11; 357/30, 37

[56] References Cited

U.S. PATENT DOCUMENTS

| | | | |
|---|---|---|---|
| 4,847,521 | 7/1989 | Huignard et al. | 307/425 |
| 4,980,891 | 12/1990 | Izadpanah | |
| 5,105,240 | 4/1992 | Omura | 357/19 |
| 5,119,227 | 6/1992 | Dowson et al. | 359/244 |
| 5,264,960 | 11/1993 | Glance | |
| 5,357,243 | 10/1994 | Fatehi et al. | 359/341 |
| 5,434,701 | 7/1995 | Fatehi et al. | 359/341 |

FOREIGN PATENT DOCUMENTS

WO9510795  4/1995  WIPO.

OTHER PUBLICATIONS

R. Schnabel et al, "All-optical and gate using Femtoscoend nonlinear gain dynamics in semiconductor amplifiers", *19th European Conference on Optical Communication (ECOC)*, vol. 2, 12 Sep. 1993, Montreux, CH, pp. 133–136, XP 000492189.

M. Eiselt et al, "All-optical regenerator using a semiconductor laser amplifier in a loop mirror configuration", *OSA Proceedings on Photonics in Switching*, vol. 16, 15 Mar. 1993, Washington, US, pp. 207–210, XP 000473865.

*Primary Examiner*—Mark Hellner
*Attorney, Agent, or Firm*—Sughrue,Mion,Zinn,Macpeak & Seas, PLLC

[57] ABSTRACT

Logic operations are carried out on binary optical signals using a non-linear optical amplifier having a front port and a rear port respectively receiving a front wave and a modulated rear wave. The output wave via the rear port is separated from the rear wave by exploiting the fact that they have opposite propagation directions. Applications include optical data switching and transmission.

12 Claims, 4 Drawing Sheets

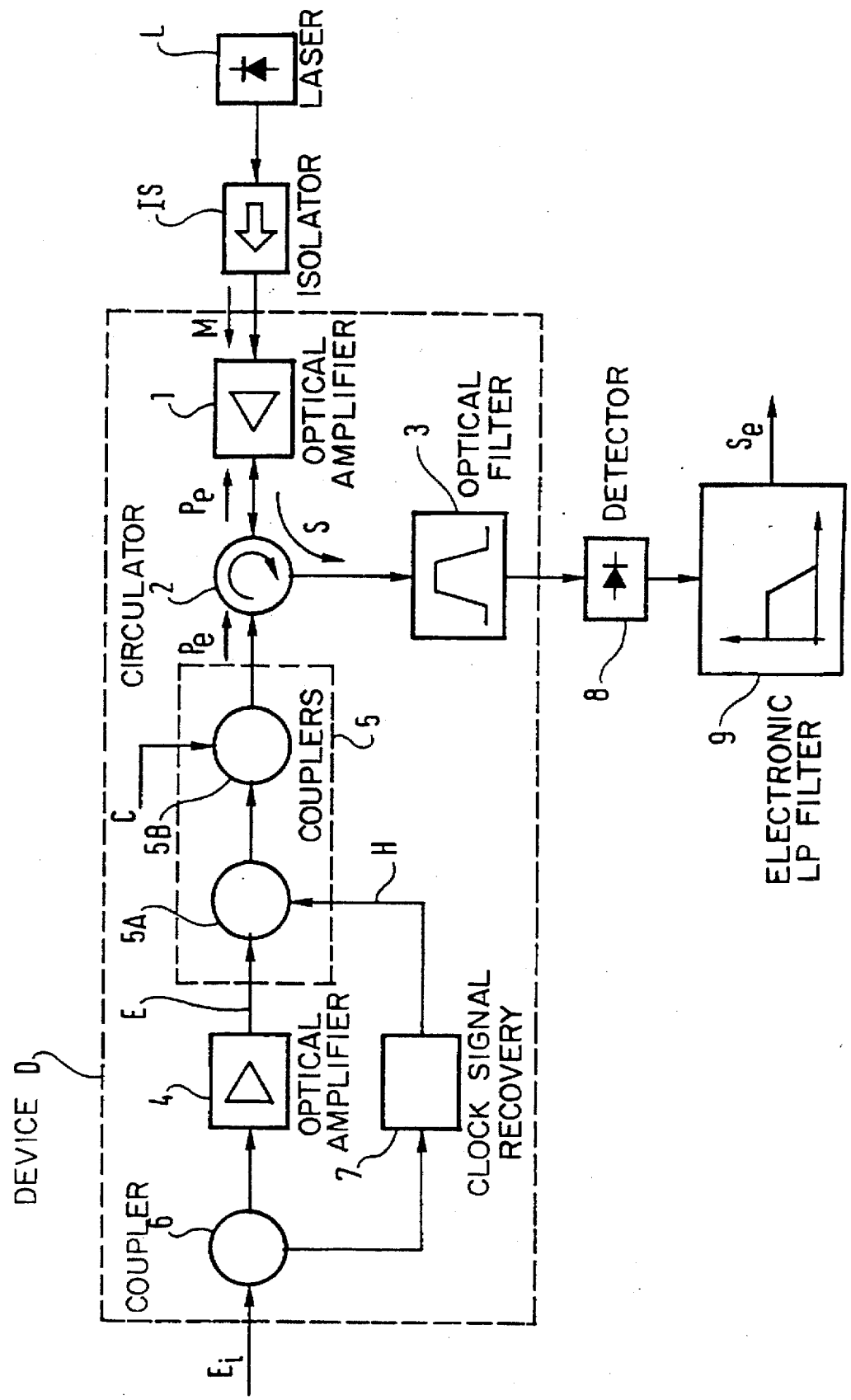

METHOD AND DEVICE FOR COMBINING OPTICAL SIGNALS

BACKGROUND OF THE INVENTION

1. Field of the Invention

The invention concerns optoelectronic systems that can be used to transmit or to switch digital data, for example.

A first object of the invention is to combine modulated optical signals by optical means only, i.e. to perform logic operations on signals modulating optical waves.

2. Description of the Prior Art

Operations of this kind are used to modify a binary data stream in the form of pulses modulating an optical carrier, for example. It is useful to be able to selectively delete some pulses or to insert binary information by inverting the pulse levels. Logic operations can also be used for purposes of resynchronization, for example to eliminate jitter, i.e. phase fluctuations of the rising or falling edges of pulses.

Until now the problem of inserting binary data has been solved by using optical couplers. This solution is unsatisfactory, however, since it requires an optical source with a wavelength equal to that of the carrier of the received pulses.

One way to delete optical data is to use an electrically controlled optical amplifier. However, electrical control does not allow very fast operation, in particular because of capacitive effects inherent in electrical control methods.

Similarly, resynchronization problems have until now been solved by electronic means, requiring optical-electronic conversion and vice versa.

The invention is therefore directed to overcoming the drawbacks of the solutions mentioned above by providing an entirely optical solution enabling very fast operation combined with simple fabrication in a form suitable for integration. To this end it is proposed to exploit the properties of non-optical amplifiers such as semiconductor amplifiers, i.e. amplifiers subject to a saturation phenomenon which reduces the dynamic gain as the optical power of the input signal increases. Semiconductor optical amplifiers in which this property is inherent can be used. An amplifier of this kind can be used in a so-called "contradirectional" mode in which optical waves with opposite propagation directions are introduced into the amplifier. FIG. 1 shows an arrangement corresponding to this mode of operation. The amplifier 1 includes an active layer CA inside the semiconductor substrate through which a current I passes. The amplifier 1 has two opposite faces R1 and R2 constituting ports through which two opposite direction input optical waves Pe, M can be applied by means of optical fibers F1, F2. The faces R1 and R2 being treated to reduced reflections, the amplifier 1 supplies through one face R1 an output optical wave S resulting in practise from amplification of the single input wave M. The output wave S has the same wavelength as the input wave M, with an amplitude that depends on the degree of saturation of the amplifier imposed by the total optical power of the two input waves Pe and M.

An amplifier of this kind can also be used in a so-called "codirectional" mode in which the input waves are applied to the same face of the amplifier. In this mode of operation the same saturation phenomenon is naturally observed, but exploiting it requires input waves with wavelengths that are sufficiently different to allow the output wave S to be filtered correctly, i.e. to retain only the amplified counterpart of one of the input waves. These constraints do not apply in the contradirectional mode, which makes it possible to dispense with a filter and to use input waves having the same wavelength.

The invention is based on the above remarks.

SUMMARY OF THE INVENTION

The invention consists in a method of producing an optical output signal by combining a plurality of optical input signals using a non-linear optical amplifier having a front port and a rear port, in which method an amplitude modulated rear optical wave is applied to the rear port, a front optical wave is applied to the front port, the output signal is the wave output via the rear port, the modulation of the rear wave is such as to enable control of the saturation of the amplifier and the output wave is separated from the rear wave by exploiting the fact that their propagation directions are opposite.

A first possibility is for the method to be adapted to insert pulses into a received pulse stream. For this, the rear wave is an amplitude modulated first signal wave and the front wave is amplitude modulated to constitute a second signal wave.

Another possibility is for the method to be adapted selectively to delete pulses constituting a received pulse stream. In this case, the amplitude of said front wave being fixed at a particular value, said rear wave is the result of superposing an amplitude modulated first signal wave and a reset to zero wave the amplitude of which can take a low value or a high value, said signal wave is modulated to enable control of the saturation of the amplifier when the amplitude of the reset to zero signal is low and said high value of the reset to zero wave is sufficient to saturate the amplifier independently of the amplitude of said first signal wave.

To process or transmit a synchronous signal it is often necessary to retime the pulses of the signal using a reference clock. The invention provides a solution to this problem by having the rear wave result from the superposition of a first signal wave amplitude modulated between a first low level and a first high level and a synchronization wave amplitude modulated between a second low level and a second high level, said first and second low levels and said first and second high levels being chosen so that the amplifier is not saturated if and only if the amplitudes of the first signal wave and the synchronization wave respectively correspond to the first and second low levels.

The invention also consists in a device for implementing the method of the invention, comprising:

a non-linear optical amplifier having a front port and a rear port, the front port being adapted to receive a front optical wave, and a spatial separator comprising a first port for receiving a modulated rear optical wave, a second port for transmitting the modulated optical wave and an output third port, the second port being connected to the rear port of the amplifier and the third port constituting the output of the device.

Other aspects and advantages of the invention will emerge from the remainder of the description with reference to the figures.

BRIEF DESCRIPTION OF THE DRAWINGS

FIG. 7 shows one embodiment of the device of the invention.

DETAILED DESCRIPTION OF THE PREFERRED EMBODIMENTS

Figure 1:
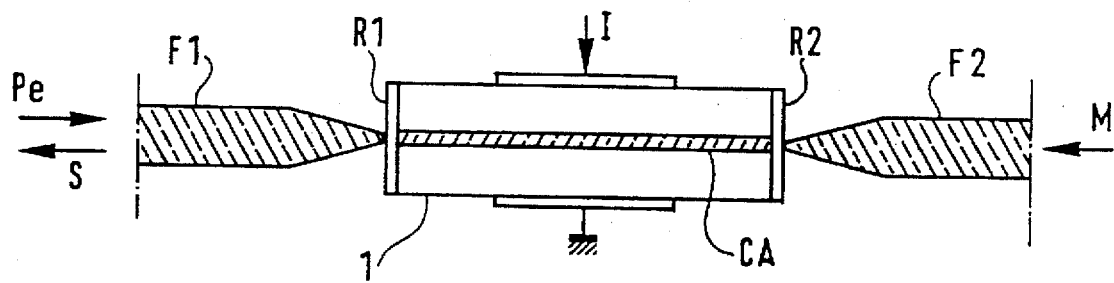
FIG. 1 is a schematic representation of a semiconductor optical amplifier that can be used in the invention.
Figure 2:
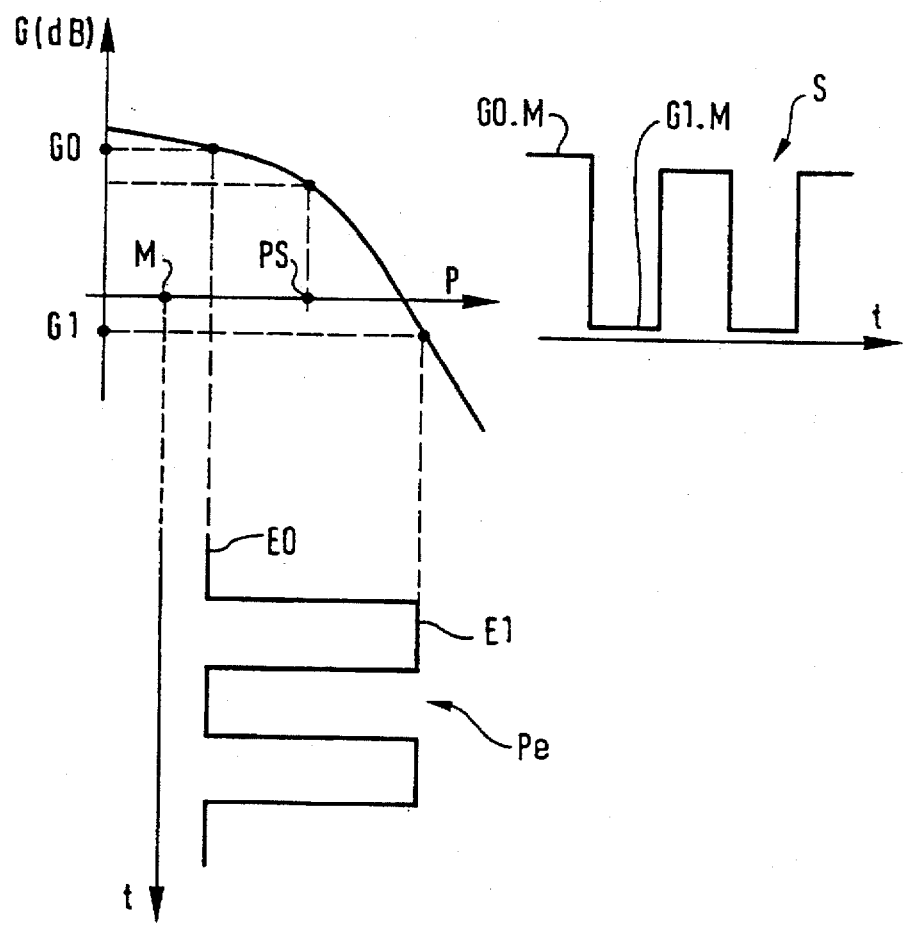
FIG. 2 shows a characteristic gain curve of the amplifier.

The curve shown in FIG. 2 represents the variation in the gain G (in decibels) as a function of the total optical power P introduced into the active layer CA of the amplifier 1 shown in FIG. 1. If the total power P is less than a limit value Ps called the saturation power the gain G has a high value that is only slightly dependent on the power P. Beyond this value the gain G falls quickly as the power P increases. The saturation power Ps is in practise defined as the power at which the gain G is 3 dB down on the maximum gain.

When a front wave M of constant amplitude is fed in via the front face R2 of the amplifier 1 and a rear wave Pe modulated between a low level E0 and a high level E1, for example, is fed in via the rear face R1, the gain G of the amplifier varies between a high value G0 and a low value G1. The output wave S then has an amplitude varying between the values $G_0 \cdot M$ and $G_1 \cdot M$, 180° out of phase with the rear wave Pe. The rear wave Pe therefore controls the saturation of the amplifier 1, and if the amplitude E1 is sufficient to cause strong saturation of the amplifier, its dynamic gain is reduced, which attenuates the effects of the fluctuations in the amplitude E1. As the extinction rate increases with the degree of saturation, signal quality is preserved.

Figure 3:
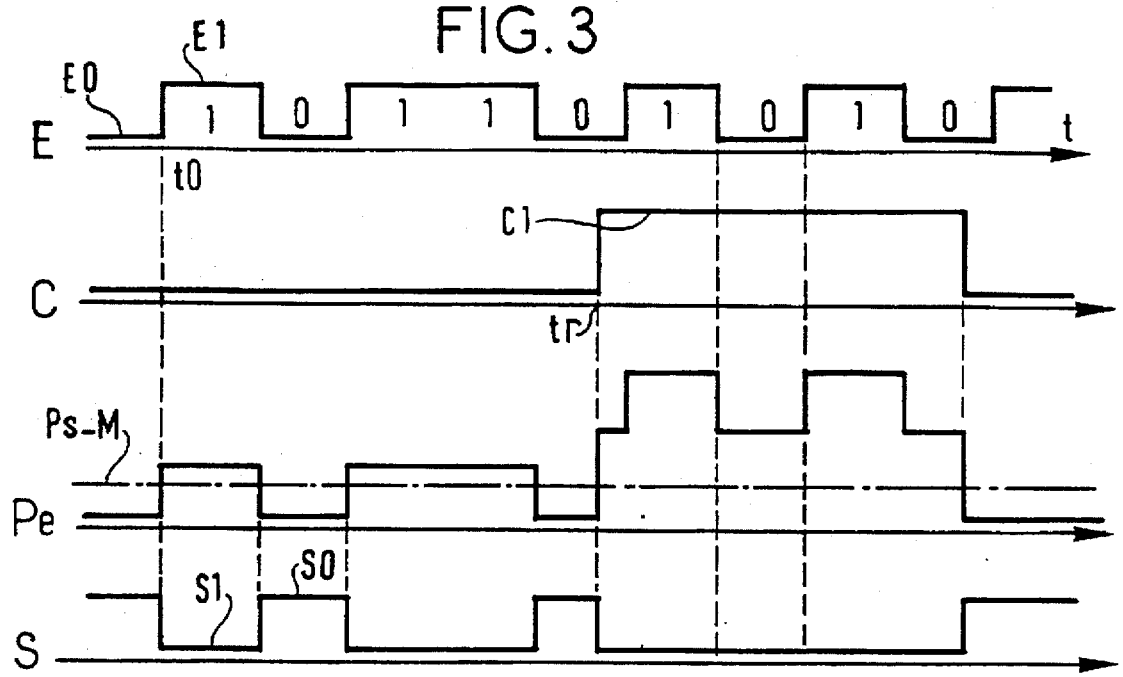
FIG. 3 shows various timing diagrams used to explain the method of the invention in the case of deleting pulses.

The timing diagrams shown in FIG. 3 illustrate the deletion of pulses by means of the method of the invention. It is assumed that an input optical signal E representing binary data, for example, modulates an optical carrier to provide pulses such as those shown in the figure. An optical reset signal C is also amplitude modulated and remains at its low level until time tr at which it rises to a high level. The signals E and C are superposed by appropriate optical coupling means to form the rear wave Pe applied to the rear face R1 of the amplifier. If the high level E1 of the signal E is sufficient when added to the front wave M to saturate the amplifier 1 (E1>Ps−M) an output wave S is obtained modulated in accordance with the timing diagram shown. Thus until time tr the signal S reproduces the complemented signal E and from time tr, and for as long as C remains in the high state, the signal S is forced to the low state.

Figure 4:
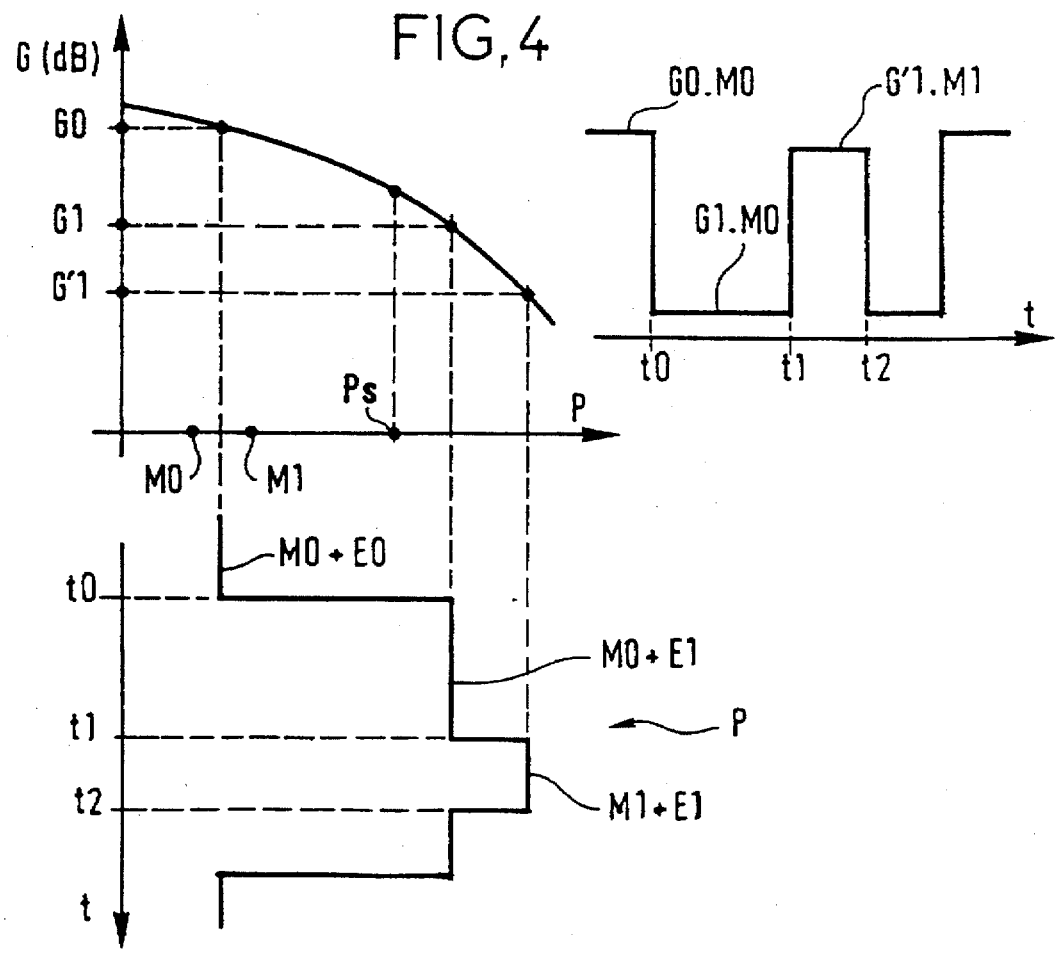
FIG. 4 shows another characteristic gain curve of the amplifier in an operating region enabling the insertion of pulses.
Figure 5:
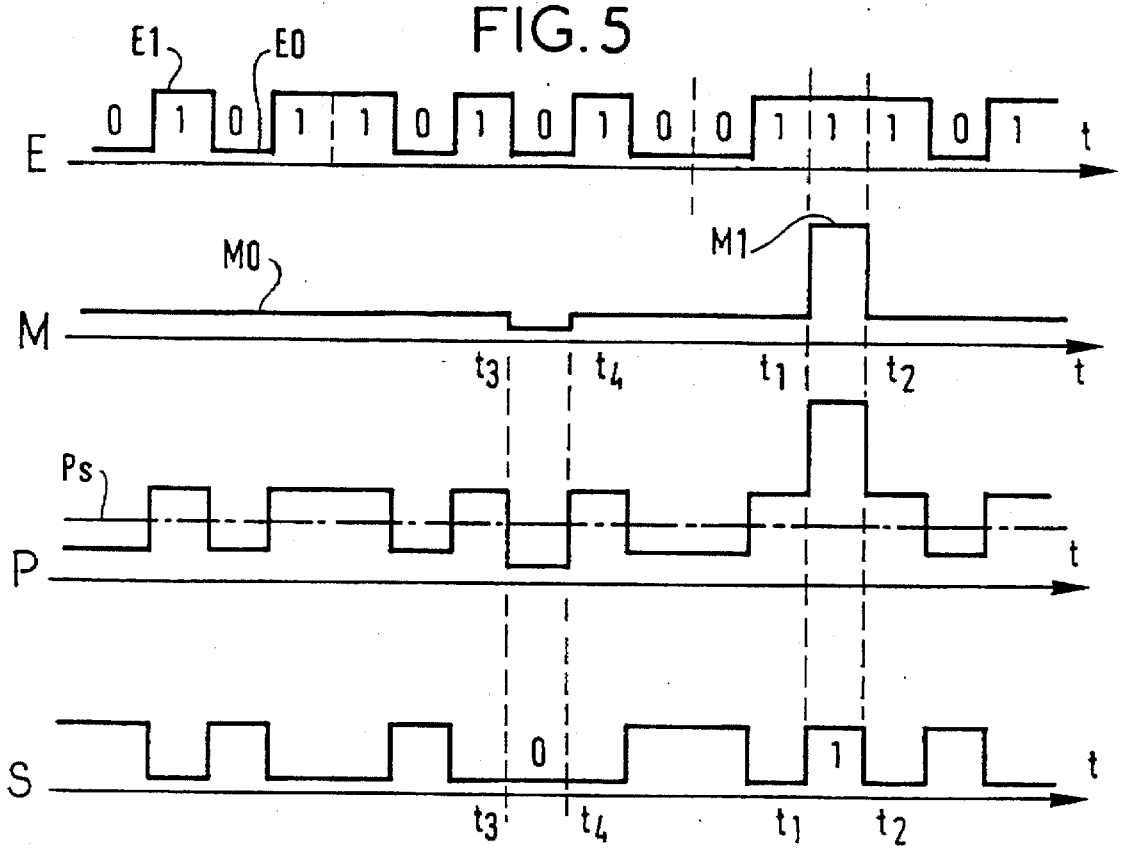
FIG. 5 shows various timing diagrams used to explain the method of the invention in the case of inserting pulses.

The insertion of pulses will now be described with reference to FIGS. 4 and 5. It is assumed first that the front wave M can be modulated between two levels M0 and M1, M1 being greater than M0. It is further assumed that the high level E1 of the signal E is sufficiently low for the amplifier to have a non-zero dynamic gain in all cases. Accordingly, when the front wave M has the amplitude M0, the output wave S is modulated as previously between the levels $G_0 \cdot M_0$ and $G_1 \cdot M_0$ if the signal E is modulated between the levels E0 and E1. If the amplitude of M takes the value M1 between the times t1 and t2, the output wave S will have between these times the amplitude $G'_1 \cdot M_1$, $G'_1$ corresponding to the gain of the amplifier when P=M1+E1. This inserts into the signal S a pulse obtained simply by modulating the front wave M. The amplitude M1 can advantageously be chosen so that the inserted pulse has an amplitude substantially equal to that of the normal pulses.

Note that it is also possible to eliminate a pulse by sufficiently reducing the amplitude of the front wave M. This is shown in the timing diagram between times t3 and t4.

Figure 6:
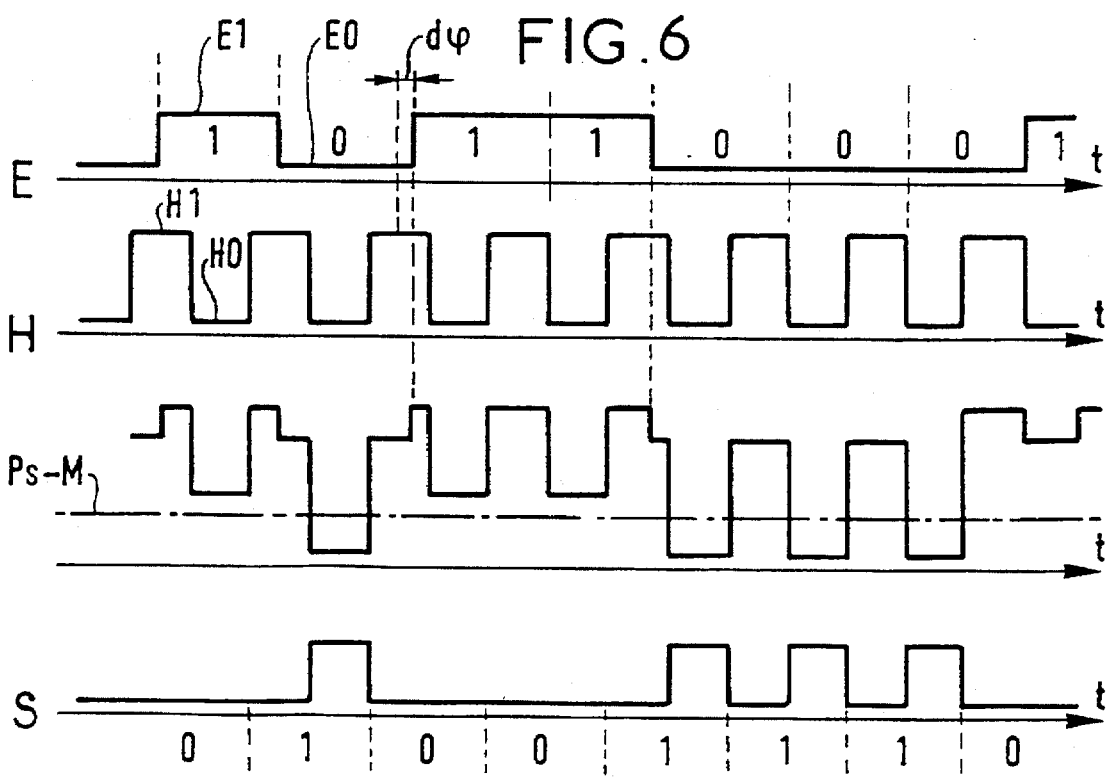
FIG. 6 shows various timing diagrams used to explain the method in the case of resynchronization.

FIG. 6 shows the resynchronization of a stream of pulses. It is assumed that the signal E can be subject to phase fluctuations dφ and must be resynchronized to the clock signal H. To achieve this these signals are superposed in such a way as to constitute the rear wave Pe. The low levels E0 and H0 and the high levels E1 and H1 of the respective signals E and H are chosen to satisfy the following conditions:

E0+H0<Ps−M

E1+H0>Ps−M

E0+H1>Ps−M

The resynchronized wave S as shown in the timing diagram is then obtained. Note that the resynchronization is accompanied by a change from NRZ (no return to zero) type modulation to RZ (return to zero) type modulation. NRZ type modulation can then be reconstituted from the signal S simply by low-pass filtering. H1 is advantageously made greater than E1.

FIG. 7 shows one embodiment of the device of the invention. The device D includes a semiconductor optical amplifier 1 of a type already described. Its front face is designed to receive the front wave M. A spatial separator such as a circulator 2 has first and second ports for respectively receiving and transmitting a rear optical wave Pe. The second port of the circulator is connected to the rear face of the amplifier by an optical fiber. A third port of the circulator 2 supplies the output wave S which is the amplified counterpart of the front wave M.

To enhance the purity of the output signal the output port of the circulator 2 is advantageously connected to an optical filter 3 the bandwidth of which is centered on the wavelength of the front wave M.

Note that the principal role of the filter is not to eliminate unwanted reflections of the rear wave Pe but rather to eliminate the effects of spontaneous emission occurring in the amplifier.

The first port of the circulator 2 is connected to the output of the coupling means 5 receiving at its input a signal wave E to be treated, a reset to zero wave C and a synchronization wave H. The coupling means 5 comprises a first optical coupler 5A receiving at its input the waves E and H and a second optical coupler 5B receiving at its input the output wave of the coupler 5A and the wave C, for example.

If necessary the high levels of the signal E can be adjusted by providing an optical amplifier 4 between the received signal Ei to be processed and the input of the coupling means 5.

The synchronization optical wave H can be supplied by a clock signal recovery device 7. In the case of an entirely optical implementation, the device 7 comprises a self-triggered laser receiving the signal Ei as input via a coupler 6.

The front wave M can be supplied by a modulatable laser source L coupled to the front face of the amplifier 1 via an isolator IS. Finally, the output of the optical filter 3 may be coupled to a detector 8 functioning as an optical-electrical converter and the output of which is connected to an electronic low-pass filter 9 supplying the signal Se.

The operation of the device has already been explained. The wavelengths of the waves concerned can be the same or different.

Of course, diverse variants of the above embodiment can be put forward without departing from the scope of the present invention. For example, if the resynchronization function is not used it is possible to dispense with the couplers 5A and 6 and the device 7. Likewise, if the reset to zero function is not used, the coupler 5B can be dispensed with. Finally, if only the pulse insertion function is used, the coupling means 5, the coupler 6 and the clock signal recovery device 7 can be dispensed with.

There is claimed:

1. A method of producing an optical output signal by combining a plurality of optical input signals using a non-linear optical amplifier having a front port and a rear port, comprising the steps of:

applying an amplitude modulated rear optical wave to said rear port;

applying a front optical wave to said front port;

generating said output signal, from said rear optical wave and said front optical wave, as a wave output from said rear port;

modulating said rear wave to enable saturation control of said non-linear optical amplifier; and separating said output wave from said rear wave.

2. Method according to claim 1 wherein said rear wave is an amplitude modulated first signal wave and said front wave is amplitude modulated to constitute a second signal wave.

3. Method according to claim 2 wherein said first signal wave is modulated so as to impart to said non-linear optical amplifier sufficient gain to transmit the modulation of said modulated front wave.

4. Method according to claim 2 wherein said front wave is modulated between a first amplitude and a second amplitude to enable said amplitude modulated first signal wave to control the saturation of said non-linear optical amplifier.

5. Method according to claim 1 further including the steps of:

fixing the amplitude of said front wave at a particular value;

forming said rear wave by superposing an amplitude modulated first signal wave and a reset to zero wave, the amplitude of which can assume a low value or a high value;

modulating said first signal wave to saturation control of said non-linear optical amplifier when the amplitude of said reset to zero signal is low and said high value of said reset to zero wave is sufficient to saturate said amplifier independently of the amplitude of said first signal wave.

6. Method according to claim 1 wherein said rear wave is the result of superposing a first signal wave amplitude, modulated between a first low level and a first high level, and a synchronization wave amplitude, modulated between a second low level and a second high level, and said first and second low levels and said first and second high levels are such that the amplifier is not saturated if and only if the amplitudes of said first signal wave and said synchronization wave respectively correspond to said first and second low levels.

7. Device for producing an optical output signal by combining a plurality of optical input signals using a non-linear optical amplifier having a front port and a rear port, comprising the steps of applying an amplitude modulated rear optical wave to said rear port, applying a front optical wave to said front port, generating said output signal, from said rear optical wave and said front optical wave, as a wave output from said rear port, modulating said rear wave to enable saturation control of said non-linear optical amplifier, and separating said output wave from said rear wave, comprising:

said non-linear optical amplifier having said front port and said rear port, said front port being adapted to receive said front optical wave, and a spatial separator comprising a first port for receiving said modulated rear optical wave, a second port connected to said rear port of said amplifier for transmitting said modulated rear optical wave to said amplifier, and a third port for outputting said optical output signal from said amplifier.

8. Device according to claim 7 wherein said third port of said spatial separator is connected to the input of an optical filter the bandwidth of which is centered on the wavelength of said front wave.

9. Device according to claim 7 wherein said first port of said spatial separator is connected to an output of optical coupling means having a plurality of inputs.

10. Device according to claim 9 wherein at least one of said plurality of inputs of said optical coupling means is connected to an output of an input optical amplifier.

11. Device according to claim 9 including an optical clock signal recovery device an output of which is connected to said optical coupling means.

12. Method according to claim 4 wherein said second amplitude is lower than said first amplitude.

* * * * *